(12) United States Patent
Huang et al.

(10) Patent No.: US 7,090,962 B2
(45) Date of Patent: Aug. 15, 2006

(54) ALKALI-SOLUBLE RESIN WITH POLYAROMATIC GROUP AND PHOTOSENSITIVE COMPOSITION COMPRISING THE RESIN

(75) Inventors: Kuo-Tung Huang, Jhudong (TW); Shi-Deh Chao, Jhonghe (TW); I-Jein Cheng, Changhua (TW); Mon-Haw Chang, Bali (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/004,374

(22) Filed: Dec. 3, 2004

(65) Prior Publication Data

US 2006/0121388 A1  Jun. 8, 2006

(51) Int. Cl.
- G03C 1/73 (2006.01)
- G03F 7/032 (2006.01)
- G03F 7/028 (2006.01)
- C08F 10/14 (2006.01)
- C08F 8/00 (2006.01)

(52) U.S. Cl. .................. 430/281.1; 430/285.1; 430/910; 430/916; 526/284; 525/132; 525/327.3; 525/384

(58) Field of Classification Search ............... None
See application file for complete search history.

(56) References Cited

U.S. PATENT DOCUMENTS 4,699,870 A * 10/1987 Iwadate et al. ............ 430/296
5,395,721 A * 3/1995 Kato et al. .................. 430/49
6,013,415 A    1/2000 Sakurai et al. .......... 430/281.1
6,087,050 A    7/2000 Itano et al. ................... 430/7
2002/0015901 A1  2/2002 Takebe et al. ................ 430/7

FOREIGN PATENT DOCUMENTS

JP    11095425    4/1999

* cited by examiner

Primary Examiner—Sin Lee
(74) Attorney, Agent, or Firm—Thomas, Kayden, Horstemeyer & Risley

(57) ABSTRACT

An alkali-soluble resin having a polyaromatic group and a photosensitive composition comprising the alkali-soluble resin. The alkali-soluble resin comprises the following recurring units:

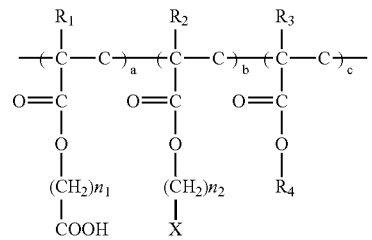

wherein each of $R_1$, $R_2$, and $R_3$, independently, is H or $CH_3$; $R_4$ is a substituted or unsubstituted polyaromatic derivative containing carbon and optionally containing one or more heteroatoms of oxygen, nitrogen and sulfur; X is alkyl, benzyl, or hydroxyl; each of $n_1$ and $n_2$, independently, is an integer of 0–8; and a, b, and c are integers when a and c respectively are not zero.

17 Claims, No Drawings

ALKALI-SOLUBLE RESIN WITH POLYAROMATIC GROUP AND PHOTOSENSITIVE COMPOSITION COMPRISING THE RESIN

BACKGROUND

The present invention relates in general to an alkali-soluble resin having a polyaromatic group and a photosensitive composition comprising the alkali-soluble resin. More particularly, it relates to a photosensitive composition which is advantageously used for forming a color filter of color liquid crystal display devices.

Photosensitive compositions for manufacture of a color filter array include photoresists for the three primary colors—red, green and blue, and black photoresist for black matrix that surrounds color pixels for improving color contrast. Since the composition is required to have high sensitivity, adhesion to the substrate, chemical resistance and the like, a negative radiation sensitive composition is generally used.

To produce a color filter from a photosensitive composition, a black photoresist is first applied to the surface of a substrate and dried, and then exposed to radiation through a photomask and developed to dissolve unexposed portions with an alkali developer, thereby forming a pixel pattern, the so-called black matrix. These steps are repeated for the red, green, and blue photoresists, thereby completing a color filter array.

The negative photosensitive composition generally includes a pigment dispersed in a resin solution which comprises (1) an alkali-soluble resin, typically a copolymer of (a) ethylenically unsaturated monomer having a carboxyl group and (b) at least one other ethylenically unsaturated monomer, (2) a polyfunctional monomer for forming a crosslinked polymer network, (3) a photoinitiator for initiating the polymerization of the polyfunctional monomer, and (4) solvent.

Since the photosensitive composition contains a pigment dispersed in a resin solution, when a color filter is formed therefrom, the following problems arise due to poor compatibility between the pigment and the resin: (1) an undissolved product (residue or scum) of the composition may remain in unexposed portions during development; (2) mura defects may occur due to uneven distribution of the ingredients; and worse, (3) the photoresist may lose function due to aggregation of the pigment during storage.

Accordingly, the invention is generally directed to solve one or more of the above problems by providing an alkali-soluble resin having improved compatibility with the pigment.

SUMMARY

According to one aspect of the invention, an alkali-soluble resin containing a polyaromatic group is provided. An exemplary alkali-soluble resin comprises the following recurring units:

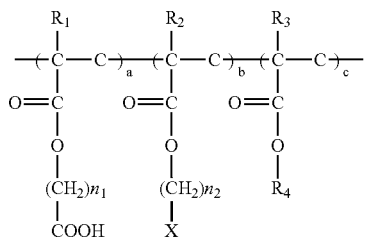

wherein each of $R_1$, $R_2$, and $R_3$, independently, is H or $CH_3$; $R_4$ is a substituted or unsubstituted polyaromatic derivative containing carbon and optionally containing one or more heteroatoms of oxygen, nitrogen and sulfur; X is alkyl, benzyl, or hydroxyl; each of $n_1$ and $n_2$, independently, is an integer of 0–8; and a, b, and c are integers provided that a and c respectively are not zero.

According to another aspect of the invention, a photosensitive composition comprising the above described alkali-soluble resin is provided. Besides the alkali-soluble resin, the photosensitive composition may further comprise a pigment, a polyfunctional monomer, a photoinitiator, and a solvent.

DETAILED DESCRIPTION

Each component constituting the photosensitive composition of the invention, including the improved alkali-soluble resin, will be described here in greater detail. In some embodiments, one or more of the aforementioned problems may be solved by incorporating a polyaromatic group in the alkali-soluble resin. Other objects and advantages of the invention will become apparent from the following description.

The photosensitive composition of the invention includes (a) a pigment; (b) an alkali-soluble resin having a polyaromatic group; (c) a polyfunctional monomer; (d) a photoinitiator; and (e) a solvent.

In the invention, the pigment (a) is not limited to a particular color tone and is suitably selected according to the application purpose of the obtained color filter. It may be either organic or inorganic.

Illustrative examples of the organic pigment include compounds classified into the group of pigments according to color index (C.I.; issued by The Society of Dyers and Colourists Co.) and having the following color index numbers, such as Pigment Red 122, Pigment Red 202, Pigment Red 206, Pigment Red 209, Pigment Red 177, Pigment Red 254; Pigment Yellow 13, Pigment Yellow 55, Pigment Yellow 119, Pigment Yellow 138, Pigment Yellow 139, Pigment Yellow 168; Pigment Green 7; Pigment Green 36; Pigment Blue 15:3, Pigment Blue 15:4, Pigment Blue 15:6; and C.I. Pigment Black 1 and C.I. Pigment Black 7.

Illustrative examples of the inorganic pigment include titanium oxide, barium sulfate, calcium carbonate, zinc oxide, lead sulfate, yellow lead, zinc yellow, red iron oxide (III), cadmium red, ultramarine blue, Prussian blue, chromium oxide green, cobalt green, amber, titanium black, synthetic iron black, carbon black and the like.

These pigments may be used alone or in admixture of two or more. Of these inorganic black pigments, carbon black is particularly preferred as it provides superior light blocking efficiency. Commercially available carbon blacks include LFF-MA7, LFF-MA100, HCF-#2650, and MCF-88 by Mitsubishi Chemical Corporation, Special 4A and FW-18 by Degussa Corp., S90B and Mogul L by Cabot Corp., and RAVEN 1200 and RAVEN 2000 by Columbian Chemical Co. The particle size of the black pigment is generally 0.05 to 0.5 µm, preferably 0.08 to 0.15 µm. When the particle size is less than 0.05 µm, the viscosity of the photosensitive composition may be undesirably high, and the optical density thereof tends to decrease due to increased transmittance. Conversely, when the particle size is more than 0.5 µm, the optical density may also decrease due to poor stability.

The pigment of the invention may be used in combination with a dispersant as required to control the particle size distribution and increase compatibility with the alkali-soluble resin. The dispersant is, for example, a cationic, anionic, or nonionic surfactant, and preferably a polymeric dispersant.

The alkali-soluble resin (b) of the invention includes the following recurring units:

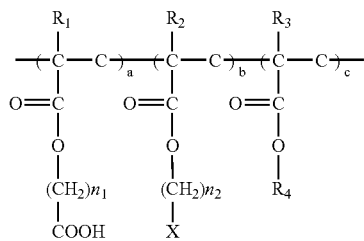

wherein each of $R_1$, $R_2$, and $R_3$, independently, is H or $CH_3$; $R_4$ is a substituted or unsubstituted polyaromatic derivative containing carbon and optionally containing one or more heteroatoms of oxygen, nitrogen and sulfur; X is alkyl, benzyl, or hydroxyl; each of $n_1$ and $n_2$, independently, is an integer of 0–8; and a, b, and c are integers when a and c respectively are not zero.

Preferred examples of the polyaromatic derivative $R_4$ include derivatives of naphthyl, anthryl, and phenanthrenyl. Preferred examples of the heteroatom-containing $R_4$ include derivatives of quinolinyl, benzothiophenyl, and benzofuroxanyl. In some embodiments, the polyaromatic group R4 may potentially impart pigment affinity to the alkali-soluble resin, such that the aforementioned problems such as scum, mura defects, or aggregation of pigments due to poor compatibility with pigment may be solved. The proportion of the recurring unit with the polyaromatic group in the copolymer resin (c/a+b+c) is preferably 1 to 50%, more preferably 5 to 25%. The weight average molecular weight of the alkali-soluble resin is preferably controlled at 3,000 to 300,000, more preferably 6,000 to 20,000 to provide desired coating ability and developability. The average polymerization degree of the resin is about 1.2–4.3, preferably about 1.2–3.8.

The alkali-soluble resin with a polyaromatic group can be formed by either copolymerizing a monomer having a polyaromatic group, or introducing a polyaromatic group to a copolymerized resin. In the first approach, the alkali-soluble resin is formed by copolymerizing (a) an ethylenically unsaturated monomer having a carboxyl group such as acrylic acid and methacrylic acid, (b) an ethylenically unsaturated monomer having a polyaromatic group, and optionally (c) one or more other ethylenically unsaturated monomers. The copolymerization may be affected at 60–120° C., preferably 65–100° C. for about 4 hours. Useful catalysts for this reaction include 2,2'-azobisisobutyronitrile (AIBN) and benzoyl peroxide (BPO).

Preferred examples of the ethylenically unsaturated monomer include methacrylates such as methyl (meth) acrylate, benzyl (meth)acrylate, ethyl (meth)acrylate, 2-hydroxyethyl (meth)acrylate, hydroxylpropyl (meth)acrylate, and isobutyl (meth)acrylate; and acrylates such as methyl acrylate, benzyl acrylate, ethyl acrylate, 2-hydroxyethyl acrylate, hydroxylpropyl acrylate, and isobutyl acrylate.

The ethylenically unsaturated monomer having a polyaromatic group can be prepared by reacting an ethylenically unsaturated monomer having an epoxy group with a polyaromatic compound having a hydroxyl group or carboxylic group via an epoxy ring-opening reaction. As an illustrative example, 10–30 parts by weight of the monomer having an epoxy group is dissolved in 100 parts by weight of solvent, followed by addition of an equivalent amount of the polyaromatic compound and 0.5–5 parts by weight of methyl benzenesulfonic acid as catalyst. After reaction for about 4 hours, the monomer having a polyaromatic group can be obtained, which may be further purified as white solid products. The reaction may be affected at 70–110° C., preferably 80–100° C. Useful solvents for this reaction include toluene, p-xylene, methyl ethyl ketone, and cyclohexanone.

Illustrative examples of the monomer having an epoxy group include 2,3-epoxypropyl methacrylate, glycidyl vinyl ether, glycidyl vinyl benzyl ether, wherein 2,3-epoxypropyl methacrylate is particularly preferred. Illustrative examples of the polyaromatic compound having a hydroxyl group include phenol, 8-naphthalenemethanol, and 7-anthracenemethanol, wherein 8-naphthalenemethanol, and 7-anthracenemethanol are particularly preferred. Illustrative examples of the polyaromatic compound having a carboxylic group include 1-naphthoic acid, 2-naphthoic acid, 2-naphthyloxyacetic acid, 1-naphthyloxyacetic acid, 1-anthracenecarboxylic acid, 2-anthracenecarboxylic acid and 9-anthracenecarboxylic acid, wherein 2-naphthoic acid and 2-anthracenecarboxylic acid are particularly preferred. The polyaromatic compound may contain one or more heteroatoms of oxygen, nitrogen and sulfur. Illustrative examples of such polyaromatic compounds include 2-quinolinylmethanol, 1-benzofuroxan-2-ylmethanol, (benzo[b]thiophen-3-yl) methanol, and (benzo[b]thiophen-2-yl)methanol.

Alternatively, as a second approach, the alkali-soluble resin having a polyaromatic group is by formed by introducing a polyaromatic group to a copolymerized resin. In this approach, an alkali-soluble resin having an epoxy group is first prepared by copolymerizing (a) an ethylenically unsaturated monomer having a carboxyl group such as acrylic acid, and methacrylic acid, (b) an ethylenically unsaturated monomer having an epoxy group, and optionally (c) one or more other ethylenically unsaturated monomers. Subsequently, the alkali-soluble resin having an epoxy group is reacted with a polyaromatic compound having a hydroxyl group or carboxylic group via an epoxy ring-opening reaction, thus inserting a polyaromatic derivative to the alkali-soluble resin. The polyaromatic compounds used in the first approach are also suitable for use herein.

The photosensitive composition of the invention further includes a polyfunctional monomer (c) containing at least two polymerizable ethylenically unsaturated bonds for forming a crosslinked polymer network. Preferred examples of the polyfunctional monomers include ethylene glycol dimethacrylate, 1,4 butanediol diacrylate, diethylene glycol diacrylate, pentaerythritol triacrylate, ethoxylated trimethylpropane triacrylate, dipentaerythritol pentaacrylate, ethoxylated pentaerythritol tetraacrylate, pentaerythritol tetraacrylate, and dipentaerythritol hexaacrylate. These polyfunctional monomers may be used alone or in admixture of two or more.

The photosensitive composition of the invention also includes a photoinitiator (d) which produces active species capable of initiating the polymerization of the polyfunctional monomer, such as radical, cationic and anionic species, when irradiated with radiation such as visible light, ultraviolet (UV) light, far ultraviolet light, electron beam or X-ray. Preferably, the photoinitiator is UV initiator exhibiting maximum UV absorption at a wavelength below 400 nm.

Preferred examples of the photoinitiators include acetophenone compounds, benzoin compounds, benzophenone compounds, thioxanthone compounds, and anthraquinone compounds. Specific examples of the acetophenone compounds include 2-methyl-1-(4-(methylthio)phenyl)-2-morpholino-propane-1,1-hydroxy cyclohexyl phenyl ketone, diethoxyacetophenone, 2-hydroxy-2-methyl-1-phenyl-propane-1-one, and 2-benzyl-2-(dimethylamino)-1-[4-(4-morpholinyl)phenyl]-1-butanone. Specific examples of the benzoin compounds include benzoin, benzoin methyl ether, and benzyl dimethyl ketal. Specific examples of the thioxanthone compounds include isopropylthioxanthone, and 2-chlorothioxanthone. A specific example of the anthraquinone compounds is 2-ethylanthraquinone.

The above photoinitiator may be used alone or in admixture of two or more. For example, a high initiation speed can be obtained by a mixture of isopropylthioxanthone and 2-benzyl-2-(dimethylamino)-1-[4-(4-morpholinyl)phenyl]-1-butanone.

The photosensitive composition of the invention is generally prepared as a liquid composition by adding a solvent (e). Any solvent can be properly selected for use as long as it dissolves or disperses the above components forming the photosensitive composition, does not react with these components, and exhibits appropriate volatility. Specific examples of the solvent include cyclohexanone, ethylene glycol ether, ethylene glycol monoethyl ether, ethylene glycol monobutyl ether, propylene glycol monomethyl ethyl acetate, and ethyl-2-ethoxyethyl acetate. These solvents may be used alone or in admixture of two or more.

Furthermore, the photosensitive composition of the invention may further include additives such as surfactants, dispersion aids, leveling agents, defoaming agents, adhesion accelerators, and the like, to improve the coating ability. These optional components and appropriate amounts are well known to those of skill in the art and, accordingly, will not be described herein in detail.

The solid content of the photosensitive composition of the invention may be altered by the choice of the coating methods and the desired film thickness, but is generally between about 15–40%. For example, for forming a 1–1.5 µm-thick film by spin coating, the solid content is preferably controlled at about 18–28%.

Preferable amounts of each components constituting the photosensitive composition of the invention are listed below.

| Component | Parts by weight |
| --- | --- |
| Alkali-soluble resin | 2–15 |
| Polyfunctional monomer | 4–7 |
| Photoinitiator | 1–5 |
| Pigment | 8–20 |
| Dispersant | 0.8–10 |
| Solvent | 60–85 |

The photosensitive composition may be prepared by first dispersing the pigment with a dispersant, and then incorporating the remaining components at high speed stirring.

A method of forming a color filter using the photosensitive composition of the present invention will be described.

A photosensitive composition having a black pigment dispersed therein is coated on a substrate by, for example, spin coating, and the coated substrate is prebaked to evaporate the solvent. Thus, a coating film is formed. Thereafter, the coating film is exposed to radiation through a photomask and developed with an alkali developer to dissolve and remove unexposed portions of the coating film. The resulting coating film is then post-baked to form a black matrix to define portions for forming pixels.

Thereafter, photosensitive compositions with red, green, and blue pigments dispersed therein are coated on the substrate, which is then prebaked and exposed to radiation to form a coating film, which is then developed and post-baked in the same manner as previously described to form arrays of red, green, and blue pixels on the same substrate sequentially. Thus, a color filter having arrays of red, green and blue pixels arranged on the substrate is obtained.

The pre-bake is preferably at 60–110° C. for 0.5–5 minutes, and the post-bake is preferably 180–220° C. for 0.2–1 hours. The irradiation energy of the radiation is preferably 80 to 300 mJ/cm$^2$. The alkali developer is preferably an aqueous solution of sodium carbonate, sodium hydroxide, potassium hydroxide, or the like.

Without intending to limit it in any manner, the present invention will be further illustrated by the following examples.

MONOMER PREPARATION EXAMPLE 1

In a 250 ml three-neck reactor equipped with a stirring rod and a condenser, 25 g of 8-naphthalenemethanol was dissolved in 100 g of methyl ethyl ketone at 70° C. To the solution, 22.5 g of epoxypropyl methacrylate, and 3 g of methyl benzenesulfonic acid as catalyst were added for reaction. The reaction mixture was stirred for 4 hours, neutralized with 10 ml of saturated sodium bicarbonate solution, and extracted with ethyl acetate (30 ml×3). The organic layer was collected, dried over anhydrous magnesium sulfate, and concentrated to give a light yellow solid, which was recrystallized from ether/n-hexane to yield a monomer with a naphthyl group as a white solid.

MONOMER PREPARATION EXAMPLE 2

The same procedure as described in Preparative Example 1 was repeated except that 8-naphthalenemethanol was replaced by 25 g of 7-anthracenemethanol. A monomer with an anthryl group was obtained as a yellow solid.

RESIN PREPARATION EXAMPLE 1

Into a 1 L four-neck reactor equipped with a stirring rod, a condenser, and a nitrogen inlet, 287.69 g of propylene glycol monomethyl ether acetate (PGMEA) was charged and heated to 90° C. To the reactor, which was maintained at 90° C., a solution containing 1.68 g of 2,2'-azobisisobutyronitrile (AIBN), 1.68 g of dodecanethiol, 177.62 g of benzylmethacrylate (BzMA), 38.33 g of maleic acid anhydride (MAA), 29.51 g of 2-hydroxyethyl methacrylate (2-HEMA), and 10 g of the monomer of Monomer Preparation Example 1 in 82.92 g of PGMEA was added at a rate of about 3 cc/min with stirring at 250 rpm. After the addition was completed within about 2–2.5 hours, the mixture was allowed to stir for additional one hour. Thus, a resin solution was obtained with a solid content of 41.1%. The acid value of the solution was measured at about 96.5.

RESIN PREPARATION EXAMPLE 2

The same procedure as described in Resin Preparation Example 1 was repeated except that the monomer of Monomer Preparation Example 1 was replaced by that of Monomer Preparation Example 2. A resin solution was obtained with a solid content of 41.3%. The acid value of the solution was measured at about 94.5.

RESIN PREPARATION EXAMPLE 3

The same procedure as described in Resin Preparation Example 1 was repeated except that the monomer of Monomer Preparation Example 1 was not added. A solution comprising an alkali-soluble resin without a polyaromatic group was obtained with a solid content of 38.8%. The acid value of the solution was measured about 102.1.

EXAMPLE 1

In a 250 ml PE grinding jar charged with 125 ml of zirconium balls of 1 mm diameter, 25 g of red pigment (Ciba, C.I. Pigment Red 254), 85 g of PGMEA, and 12.5 g of dispersant BYK-2001 (BYK Chemie, 52% active ingredient) were dispersed using a Red Devil mill for 4 hours. The zirconium balls were filtered off to obtain a dispersion. The dispersion was placed in a 500 ml three-neck reactor, and under nitrogen atmosphere, a solution containing 20 g of the resin solution of Resin Preparation Example 1, 6 g of dipentaerythritol hexaacrylate as polyfunctional monomer, 4.5 g of 2-benzyl-2-(dimethylamino)-1-[4-(4-morpholinyl)phenyl]-1-butanone as photoinitiator, and 0.5 g of isopropylthioxanthone as photoinitiator in 96.7 g of PGMEA was added thereto. After the addition was completed, the mixture was allowed to stirred for 2 hours, thus obtaining a red photosensitive composition.

The photosensitive resin composition was spin-coated onto a glass substrate, which was spun at 600 rpm for 15 seconds and then ramped to a final spin speed of 900 rpm for 20 seconds. After pre-baking at 90° C. for 2 minutes, the substrate was exposed to 150 mJ/cm² of ultraviolet light through a photomask, immersed in a 0.5% KOH aqueous solution for development, washed with water and dried. Thereafter, the substrate was post-baked at 230° C. for 1 hour, thus obtaining a photoresist pattern on the glass substrate.

The developability was evaluated through an 100× optical microscope. The developability of the unexposed portions was evaluated as "Good" if no scum was seen, "Moderate" if only a few stains (less than 1 µm in diameter) were observed, "Poor" if stains of more than 1 µm in diameter were present, and "Bad" if the unexposed portion was not removed.

The storage stability was evaluated as follows. The photosensitive composition was cooled to −10° C., left standing for 4 hours, heated to 20° C., and left standing for another 4 hours. The cooling and heating were repeated for 3 cycles. The viscosity before and after the thermal cycle was determined. The stability was evaluated as "Good" if the variation in viscosity was less than 5%, "Moderate" if between 5–10%, and "Poor" if greater than 10%. The results of evaluations of developability and stability are listed in Table 1.

EXAMPLE 2

The same procedure as described in Example 1 was repeated except that the pigment was replaced by a green pigment (Ciba, C.I. Pigment Green 36), and the dispersant was replaced by BYK-2150 (BYK Chemie, 52% active ingredient). The results of evaluations are listed in Table 1.

EXAMPLE 3

The same procedure as described in Example 1 was repeated except that the pigment was replaced by a blue pigment (Ciba, C.I. Pigment blue 15:6), the dispersant was replaced by BYK-2150 (BYK Chemie, 52% active ingredient), and the resin solution of Resin Preparation Example 1 was replaced by that of Resin Preparation Example 2. The results of evaluations are listed in Table 1.

EXAMPLE 4

The same procedure as described in Example 1 was repeated except that the pigment was replaced by a black pigment (Degussa, FW-18), the dispersant was replaced by 12.5 g of BYK-163 (BYK Chemie, 45% active ingredient), and the resin solution of Resin Preparation Example 1 was replaced by that of Resin Preparation Example 2. The results of evaluations are listed in Table 1.

EXAMPLE 5

The same procedure as described in Example 1 was repeated except that the pigment was replaced by another red pigment (Ciba, C.I. Pigment Red 122), and the resin solution of Resin Preparation Example 1 was replaced by an equal amount of a 1:1 mixture of that of Resin Preparation Examples 1 and 2. The results of evaluations are listed in Table 1.

EXAMPLE 6

The same procedure as described in Example 1 was repeated except that the pigment was replaced by another red pigment (Ciba, C.I. Pigment Red 122), and the resin solution of Resin Preparation Example 1 was replaced by an equal amount of a 1:1 mixture of those of Resin Preparation Examples 1 and 3. The results of evaluations are listed in Table 1.

EXAMPLE 7

The same procedure as described in Example 1 was repeated except that the pigment was replaced by another red pigment (Ciba, C.I. Pigment Red 122), and the resin solution of Resin Preparation Example 1 was replaced by an equal amount of a 1:1 mixture of that of Resin Preparation Examples 2 and 3. The results of evaluations are listed in Table 1.

COMPARATIVE EXAMPLES 1–4

The same procedure as described in Examples 0.1–4 were repeated except that each of the resin solutions in Examples 1–4 was replaced by 20 g of Resin Preparation Example 3, respectively. The results of evaluations are also listed in Table 1.

TABLE 1

|  | Developability | Final Viscosity(cp)/ Stability |
|---|---|---|
| Example 1 | Good | 8.7/Good |
| Example 2 | Good | 8.8/Good |
| Example 3 | Good | 8.9/Good |
| Example 4 | Good | 12.5/Good |
| Example 5 | Good | 8.6/Good |
| Example 6 | Good | 9.6/Good |
| Example 7 | Good | 8.6/Good |
| Comp. Example 1 | Poor | 16.5/Poor |
| Comp. Example 2 | Poor | 18.8/Poor |
| Comp. Example 3 | Moderate | 15.7/Moderate |
| Comp. Example 4 | Poor | 21.6/Poor |

As can be seen from Table 1, the photosensitive composition of the invention showed improved stability and developability, as compared to that of Comparative Examples.

While the invention has been described by way of example and in terms of preferred embodiment, it is to be understood that the invention is not limited thereto, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An alkali-soluble resin comprising the following recurring units:

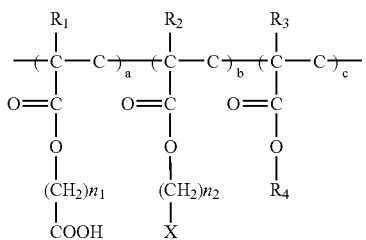

wherein
each of R1, R2, and R3, independently, is H or CH3;
R4 is a substituted or unsubstituted polyaromatic derivative containing carbon and optionally containing one or more heteroatoms of oxygen, nitrogen and sulfur;
X is alkyl, benzyl, or hydroxyl;
each of n1 and n2, independently, is an integer of 0–8; and
a, b, and c are integers when a, b, and c respectively are not zero, wherein the ratio of c/a+b+c is about 5–25%.

2. The alkali-soluble resin as claimed in claim 1, wherein R4 is a derivative of naphthyl, anthryl, or phenanthrenyl.

3. The alkali-soluble resin as claimed in claim 1, wherein R4 is a derivative of quinolinyl, benzothiophenyl, or benzofuroxanyl.

4. The alkali-soluble resin as claimed in claim 1, which is formed by copolymerizing an ethylenically unsaturated acrylic monomer having a polyaromatic group and an ethylenically unsaturated monomer having a carboxyl group.

5. The alkali-soluble resin as claimed in claim 4, wherein the acrylic monomer having a polyaromatic group is formed by reacting a polyaromatic compound, having a hydroxyl group or carboxylic group with an ethylenically unsaturated monomer having an epoxy group.

6. The alkali-soluble resin as claimed in claim 1, which is formed by reacting a polyaromatic compound having a hydroxyl group or carboxylic group with an alkali-soluble resin having an epoxy group.

7. A photosensitive resin composition, comprising
a pigment;
an alkali-soluble resin comprising the following recurring units:

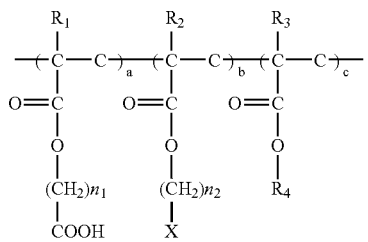

wherein
each of R1, R2, and R3, independently is H or CH3;
R4 is a substituted or unsubstituted polyaromatic derivative containing carbon and optionally containing one or more heteroatoms of oxygen, nitrogen and sulfur;
X is alkyl, benzyl, or hydroxyl;
each of n1 and n2, independently, is an integer of 0–8; and
a, b, and c are integers when a and c respectively are not zero, wherein the ratio of c/a+b+c is about 5–25%;
a polyfunctional monomer;
a photoinitiator; and
a solvent.

8. The photosensitive resin composition as claimed in claim 7, wherein the pigment is an organic pigment, an inorganic pigment, or a mixture thereof.

9. The photosensitive resin composition as claimed in claim 7, wherein the alkaline-soluble resin is about 2–15 parts by weight, based on 100 parts by weight of the photosensitive resin composition.

10. The photosensitive resin composition resin as claimed an claim 7, wherein R4 is a derivative of naphthyl, anthryl, or phenanthrenyl.

11. The photosensitive resin composition as claimed in claim 7, wherein R4 is a derivative of quinolinyl, benzothiophenyl, or benzofuroxanyl.

12. The photosensitive resin composition as claimed in claim 7, wherein the polyfunctional monomer has at least two polymerizable ethylenically unsaturated bonds in the molecule.

13. The photosensitive resin composition as claimed in claim 7, wherein the photoinitiator has the maximum absorption at below 400 nm.

14. The photosensitive resin composition as claimed in claim 7, further comprising a resin other than the alkali-soluble resin of claim 1.

15. An alkali-soluble resin comprising the following recurring units:

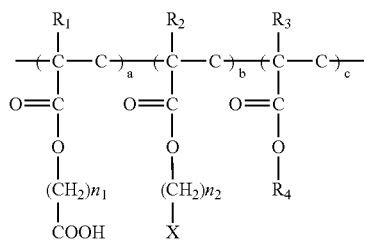

wherein
each of R1, R2, and R3, independently, is H or CH3;
R4 is a derivative of quinolinyl, benzothiophenyl or benzofuroxanyl;
X is alkyl, benzyl, or hydroxyl;
each of n1 and n2, independently, is an integer of 0–8; and
a, b, and c are integers when a and c respectively are not zero.

16. An alkali-soluble resin comprising the following recurring units:

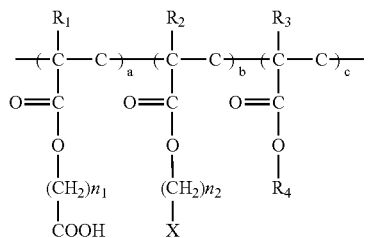

wherein
each of R1, R2, and R3, independently, is H or CH3;
R4 is a derivative of quinolinyl, benzothiophenyl, or benzofuroxanyl;
X is alkyl, benzyl, or hydroxyl;
each of n1 and n2, independently, is an integer of 0–8; and
a, b, and c are integers when a, b, and c respectively are not zero.

17. A photosensitive resin composition, comprising a pigment;
an alkali-soluble resin comprising the following recurring units:

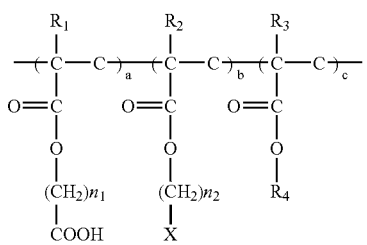

wherein
each of R1, R2, and R3, independently, is H or CH3;
R4 is a derivative of quinolinyl, benzothiophenyl, or benzofuroxanyl;
X is alkyl, benzyl, or hydroxyl;
each of n1 and n2, independently, is an integer of 0–8; and
a, b, and c are integers when a and, c respectively are not zero;
a polyfunctional monomer;
a photoinitiator; and
a solvent.

* * * * *